United States Patent [19]
Pan

[11] 4,297,656
[45] Oct. 27, 1981

[54] PLURAL FREQUENCY OSCILLATOR EMPLOYING MULTIPLE FIBER-OPTIC DELAY LINE

[75] Inventor: Jing-Jong Pan, Melbourne, Fla.

[73] Assignee: Harris Corporation, Melbourne, Fla.

[21] Appl. No.: 23,394

[22] Filed: Mar. 23, 1979

[51] Int. Cl.³ .................. H03B 5/00; H03B 17/00
[52] U.S. Cl. .................. 331/135; 250/227; 331/60
[58] Field of Search ......... 331/135, 101, 107, 108 B, 331/60; 250/227

[56] References Cited

U.S. PATENT DOCUMENTS

| | | | |
|---|---|---|---|
| 4,042,891 | 8/1977 | Levine | 331/9 X |
| 4,066,981 | 1/1978 | Levine | 331/108 B |
| 4,105,950 | 8/1978 | Dingwall | 331/135 X |

OTHER PUBLICATIONS

Schaer et al; "GHz Fundamental Acoustic-Wave Oscillators"; Microwave Journal, vol. 20, No. 1, pp. 41-42, 44; Jan. 1977.

*Primary Examiner*—Siegfried H. Grimm
*Assistant Examiner*—Edward P. Westin
*Attorney, Agent, or Firm*—Craig and Antonelli

[57] ABSTRACT

Stabilization of an oscillator, particularly an RF oscillator, is achieved by an arrangement employing a fiber optic delay line. The delay line has a Q defined by the relationship $Q = 2\pi f\tau$, where f is the oscillator operation frequency and $\tau$ is the length of the delay line. Opto/electronic and electro optic transducers are coupled between the electrical oscillator circuitry and the optical delay line for interfacing the electrical section of the RF oscillator with its optical section. This optic delay line may be configured as a single optical fiber where a single output frequency is desired, or it may be configured of a plurality of optical fibers of respectively different lengths, where plural output frequencies are to be produced.

7 Claims, 2 Drawing Figures

PLURAL FREQUENCY OSCILLATOR EMPLOYING MULTIPLE FIBER-OPTIC DELAY LINE

FIELD OF THE INVENTION

The present invention relates to high frequency oscillators and is particularly directed to a scheme for stabilizing the operation of an oscillator, especially one employed in present day communication system.

BACKGROUND OF THE INVENTION

Communication systems, radar systems, signal processors, control and timing systems require oscillators in order to carry out their intended functions; advanced signal generation systems require oscillators having low phase and FM noise and good temperature stability. In order to obtain low phase and FM noise, the oscillator should have a high loaded Q, since the phase and FM noise of an oscillator are determined by its Q. Oscillator temperature stability, on the other hand, depends principally upon the thermal expansion coefficient of the resonator so that the lower the thermal expansion coefficient, the better the temperature stability.

Prior art oscillator configurations for achieving a high Q have included large size cavities (such as circular cylindrical cavities, rectangular cavities, coaxial cavities and low frequency helical cavities). In order to obtain good temperature stability, materials utilized in these cavities commonly include metallized fuzed quartz, which unfortunately suffers from its high cost, weight and size. As additional schemes for stabilizing the operation of an oscillator, components such as surface acoustic wave (SAW) and bulk acoustic wave (BAW) delay lines have been used. However, these types of delay lines suffer the following disadvantages; presetting of the oscillation frequency cannot be achieved with precision without extreme difficulty; high insertion loss; high dispersion which limits wideband operation; deficient temperature stability; problems with hysteresis, potential aging and multimode operation; fabrication, particularly of high frequency delay line transducers, is difficult; the operation frequency and temperature ranges are limited; phase shift components are required; and hermetic sealing is required to avoid loading perturbation.

SUMMARY OF THE INVENTION

It is, accordingly an object of the present invention to provide an improved oscillator that overcomes the shortcomings of the prior art, discussed above. Particularly it is an object of the invention to provide an improved oscillator the generated frequency of which may be defined with high precision while enjoying design simplicity.

It is a further object of the present invention to provide an improved oscillator that can be easily phase locked or modulated (either optically or electronically).

It is still another object of the invention to provide an improved oscillator having excellent temperature stability, low dispersion and insertion loss and low cost. In accordance with the present invention, stabilization of an oscillator, particularly an RF oscillator, is achieved by an arrangement employing a fiber optic delay line. The delay line has a Q defined by the relationship $Q = 2\pi f \tau$, where f is the oscillator operation frequency and $\tau$ is the length of the delay line. Opto/electronic and electro optic transducers are coupled between the electrical oscillator circuitry and the optical delay line for interfacing the electrical section of the RF oscillator with its optical section. This optical delay line may be configured as a single optical fiber where a single output frequency is desired, or it may be configured of a plurality of optical fibers of respectively different lengths, where plural output frequencies are to be produced.

DETAILED DESCRIPTION

Figure 1:
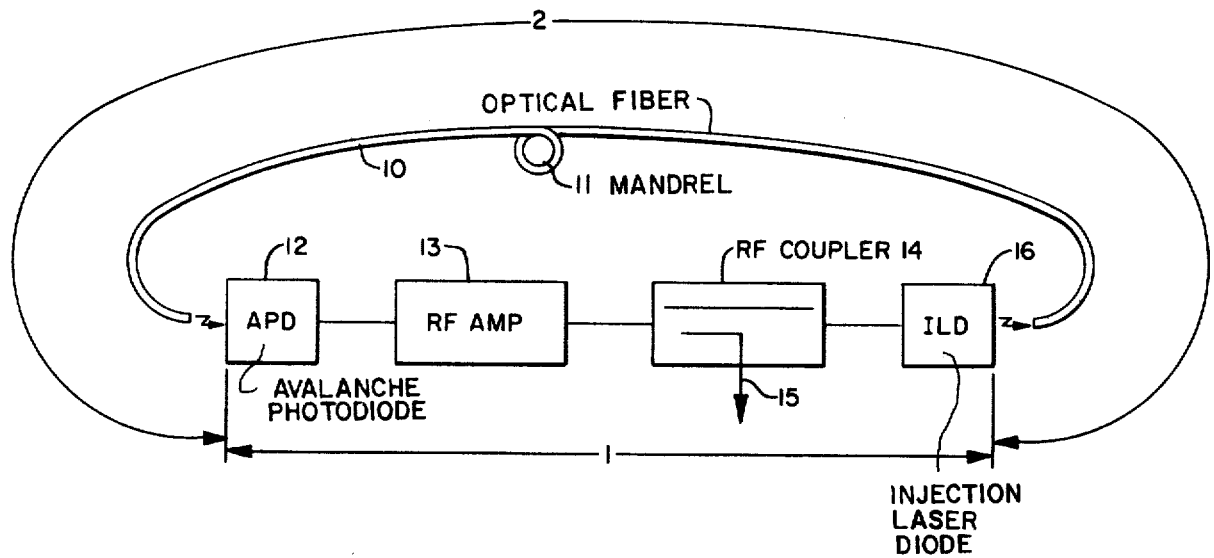
FIG. 1 is a schematic illustration of the configuration of a first embodiment of the invention.

Referring now to FIG. 1 wherein there is shown an RF oscillator configuration employing a single optical fiber delay line feedback loop in accordance with a first embodiment of the present invention, the circuit consists of an electrical section 1 and an optical section 2 coupled together in a closed loop, so that there is an effective $2n\pi$ phase shift around the loop relative of the RF oscillator frequency f to be produced and a gain equal to or greater than unity, where n=0, 1, 2 ... The electrical section 1 comprises an opto-electronic transducer or converter, such as an avalanche photo diode, 12, the input of which is coupled to one end of an optical fiber 10 by a suitable optical fiber connector (not shown), and, the output of which is coupled to an RF amplifier 13 containing a suitable impedance matching network. The output of amplifier 13 is connected through an RF coupler 14 to an electro-optic transducer, such as an injection laser diode 16. The oscillation output frequency of the loop is derived from line 15 of RF coupler 14.

Injection laser diode 16, like photo diode 12, is coupled to an end of optical fiber strand 10 of the optical section 2 of the oscillator by a suitable fiber coupler (not shown). Optical fiber 10 has a considerable length relative to the package size of the other components of the oscillator and, accordingly, may be wound around a suitable spool or mandrel 11, as shown to compact its size and limit bulkiness.

To properly set the necessary parametric ranges of values of size and electrical characteristics of the components of the oscillator, consideration must be given to desired output and frequency characteristics. As is well known, the transfer function of an optical fiber may be defined by the ratio sin x/x where x varies with operation frequency f and fiber length l. In the expression sin x/x, $x = \omega \tau / 2$, where $\omega$ is the frequency and $\tau$ is defined by the relationship $\tau = 1 \cdot \Delta n/c$, where l = the fiber length, $\Delta n$ is the difference of the index of refraction between the fiber core and the fiber cladding, and c is the velocity of light. For large f·l products the optical fiber requires equalization. At present, commercially available optical fibers have a bandwidth up to 3 GHz/km. Therefore, at operation frequencies less than or equal to 3 GHz and with a fiber length less than or equal to 1 km, equalization of the fiber is unnecessary.

For example, at an operational frequency of 2.5 GHz a 0.1 km length fiber will produce a delay of 1.0$\mu$ sec. The Q of an oscillator employing such a fiber length in its optical feedback section 2 may thus be defined as $Q = 2\pi f \cdot \tau$ or $Q = 2\pi \times 2.5 \times 10^9 \times 10^{-6} = 15.71 \times 10^3$. Since an oscillator is considered to exhibit excellent phase noise performance for a Q in excess of $4 \times 10^3$, it will be appreciated that the 3 GHz/km bandwidth of commercially available optical fiber permits exceptional performance, without the need for equalization. Moreover, even in those cases where the fiber bandwidth characteristic is exceeded, the driver circuit for the injection laser diode 16 may include an appropriate filter having the necessary frequency slope characteristic to compensate for the bandwidth characteristic of the optic fiber.

Although, in the foregoing explanation, an avalanche photo diode and an injection laser diode have been described as exemplary components for optic-electronic converter 12 and electro-optic converter 16, respectively, it should be realized that other types of elements may be used, depending upon the operational frequencies involved. For example, at frequencies less than 400 MHz, a light emitting diode (LED) may be used for converter 16, while at frequencies between several MHz and 4 GHz an injection laser diode (ILD) may be used. Above 4 GHz the driver current for the ILD must be compensated at the cost of a decrease of modulation depth. Commercially available ILDs have an upper frequency limit of about 12 GHz. Other types of electro-optic conversion components, such as lasers coupled with an electro-optic modulator (or acoustic-optic modulation), may be used, although they have the disadvantage of large size and cost.

As opto-electronic converter 12, in addition to an avalanche photodiode, as explained above, a PIN photo detector or MESFET may be used. At frequencies below 1 GHz, either an APD or PIN may be used, while a MESFET is suitable over a very wide range of frequencies, from dc to Ku-band (up to 30 GHz) with the advantages of low bias and amplification gain.

Figure 2:
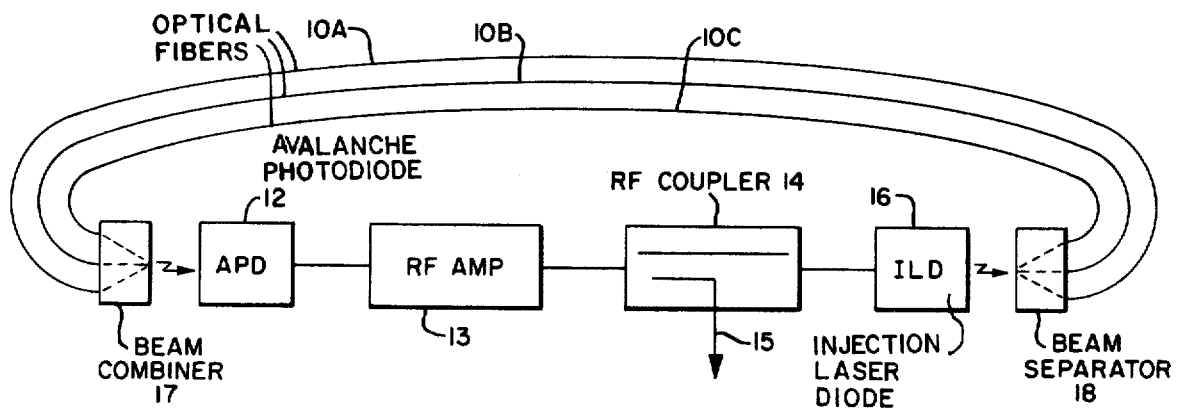
FIG. 2 is a schematic illustration of the configuration of a second embodiment of the invention.

The above described embodiment of the invention is that of an oscillator whose output consists a single frequency; however the optical fiber delay line feedback technique of the invention may be used to implement a multi-frequency oscillator. A schematic illustration of such an oscillator is illustrated in FIG. 2, wherein the same components as illustrated in FIG. 1 are shown in FIG. 2 with the corresponding reference numerals. Additionally shown in FIG. 2 are beam combiner 17 and beam splitter 18 coupled between ends of optical fibers 10A, 10B and 10C and photo detector 12 and light emitting element 16, respectively. Beam combiner 17 may be of conventional configuration to optically couple the light emitted from one end of each of fibers 10A, 10B and 10C into a single combined beam impinging upon the photo responsive surface of photodiode 12. Similarly, beam splitter 18 may be of conventional configuration to separate the light beam output of light emitter 16 into respective beams that are coupled via suitable optical fiber couplers into fibers 10A, 10B and 10C. Optical fibers 10A, 10B and 10C are of respectively different lengths to establish respectively different closed loop path lengths of 2 n$\pi$ at frequencies fA, fB and fC.

In the arrangement shown in FIG. 2, the amplitude and phase for oscillation for an individual fiber are as follows:

Amplitude:
$$Ga + Gpd + Lpd + Gc + Gs + Ls + Lf + Lb \geq 0 \quad (1)$$

where
Ga is the gain of wide band amplifier 13,
Gpd is the detection efficiency of photodetector 12
Lpd is the coupling loss from fiber 10 to detector 12,
Gc is the insertion loss of RF coupler 14,
Gs is the emission efficiency of optical source 16,
Lb is the coupling loss of the beam combiner 17 and the beam separator 18,
Ls is the coupling loss from the emitter 16 to fiber 10, and
Lf is fiber loss.

Equation (1) maybe also rewritten as $$Ga \cdot Gpd \cdot Lpd \cdot Gc \cdot Gs \cdot Ls \cdot Lf \cdot Lb \geq 1 \quad (2)$$
$$\text{Phase: } \phi a + \phi pd + \phi c + \phi s + \phi f = 2n\pi \quad (3)$$

where n = 0, 1, 2, 3
and $\phi a$, $\phi pd$, $\phi c$, $\phi s$ and $\phi f$ are the phase changes through amplifier 13, photodetector 12, coupler 14, emitter 16 and fiber 10, respectively.

For n = 1, the total phase of the oscillation loop is 360° at a given frequency.

For proper operation, equations (1) and (3) must be satisfied simultaneously. When the amplitude condition defined by equation (1) is satisfied, a new frequency will be produced for each new $\phi f$. For a three fiber system as shown in FIG. 2, where optical fibers 10A, 10B and 10C have three different lengths, there are three different phase delays $\phi fA$, $\phi fB$ and $\phi fC$. Even though a portion of each frequency fA, fB and fC passes through each fiber 10A, 10B, and 10C, the phase delay imparted by those fiber lengths that do not produce a 2n$\pi$ phase shift completely around the oscillator for a particular frequency fi does not significantly reduce the amplitude of the output frequency fi on output line 15 of RF coupler 14, since it is the length of fiber 10i that defines the frequency fi. Where complete isolation among the respective frequencies is desired, separate photodetectors and electro-optic generators coupled with the separate narrow band filters may be employed in place of the individual components described above and shown in FIG. 2.

The operation frequency range of the system is determined by the bandwidth of amplifier 13, photo detector 12, coupler 14 and emitter 15. At present, commercially available amplifiers and couplers have a multi-octave bandwidth below 2 GHz and a one octave bandwidth above 2 GHz. Both MESFET photodetectors and injection laser diodes are capable of operating over a wide bandwidth at microwave frequencies. Light emitting diodes should be used at narrow bandwidths. Currently available avalanche photodiodes are not suggested at oscillator operational frequencies above 2 GHz.

As will be appreciated from the foregoing description of the present invention, the shortcomings of the prior art described previously are effectively eliminated, so that an oscillator having an extremely high Q and thereby low phase and FM noise is obtained. Thus, an RF oscillator having the fiber-optic feedback configuration in accordance with the present invention is especially useful in all types of signal generating and transmission systems, particularly those demanding high performance, such as high resolution radar, receiving, electronic intelligence gathering systems, etc.

While I have shown and described one embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. An oscillator comprising:
   first means for generating an electrical output in response to an optical input applied thereto;
   second means, coupled to said first means, for amplifying said electrical output;
   third means, coupled to said second means, for producing an optical output in response to the amplified electrical output applied thereto from said second means; and
   fourth means, coupled to said first means and said third means, for optically transmitting the optical output produced by said third means to said first means as the optical input thereto, said fourth means including a plurality of optical fibers having respectively different phase delays therethrough through which said optical output produced by said third means travels to said first means, each of said optical fibers having a respectively different prescribed length for defining a respective effective loop phase delay of $2n\pi$ at respective frequencies of said electrical output, where $n = 0, 1, 2, \ldots$ so that a plurality of different oscillation frequencies are simultaneously produced by said oscillator.

2. An oscillator according to claim 1, wherein said second means includes means for coupling therefrom a plurality of electrical output oscillation frequencies at which respectively different loop phase delays are defined for said plurality of optical fibers.

3. An oscillator according to claim 2, wherein said oscillator is a microwave frequency oscillator operating at frequencies up to 3 GHz.

4. An oscillator according to claim 1, further including fifth and sixth means, coupled to the opposite ends of said optical fibers, for respectively combining the optical outputs therefrom as a single combined optical input to said first means, and separating the output produced by said third means into a plurality of beams optically coupled to said fibers.

5. An oscillator according to claim 4, wherein said second means includes means for coupling therefrom a plurality of electrical output oscillation frequencies at which respectively different loop phase delays are defined for said plurality of optical fibers.

6. An oscillator comprising:
   a gain producing element having an input and an output;
   a plurality of feedback paths connected between said input and said output of said gain producing element; and
   frequency determining means within said feedback paths comprising an electrical-to-optical transducer producing a light signal in response to the output of the gain producing element, a plurality of optical fibers responsive to light signals from said transducer, each respective optical fiber having a respectively different phase delay, an optical-to-electric transducer responsive to the outputs of said optical fibers, means for causing the light signals from said electrical-to-optical transducer to be coupled simultaneously through each of said optical fibers, and means for coupling light signals from each of said optical fibers simultaneously to said optical-to-electric transducer.

7. An oscillator according to claim 6, wherein each respective optical fiber provides substantially 180° of electrical delay at a respectively different frequency of oscillation.

* * * * *